(12) United States Patent
Nakahama

(10) Patent No.: US 10,594,256 B2
(45) Date of Patent: Mar. 17, 2020

(54) PHOTOVOLTAIC THERMAL COLLECTOR

(71) Applicant: Nisshinbo Mechatronics Inc., Tokyo (JP)

(72) Inventor: Hidenari Nakahama, Aichi (JP)

(73) Assignee: Nisshinbo Mechatronics Inc., Tokyo (JP)

( * ) Notice: Subject to any disclaimer, the term of this patent is extended or adjusted under 35 U.S.C. 154(b) by 0 days.

(21) Appl. No.: 15/867,699

(22) Filed: Jan. 11, 2018

(65) Prior Publication Data
US 2018/0138858 A1 May 17, 2018

Related U.S. Application Data

(63) Continuation of application No. PCT/JP2016/079881, filed on Oct. 7, 2016.

(30) Foreign Application Priority Data

Oct. 27, 2015 (JP) .................. 2015-211290

(51) Int. Cl.
*H02S 40/44* (2014.01)
*C09K 3/10* (2006.01)
(Continued)

(52) U.S. Cl.
CPC ............... *H02S 40/44* (2014.12); *C08J 5/121* (2013.01); *C08K 3/04* (2013.01); *C08K 5/14* (2013.01);
(Continued)

(58) Field of Classification Search
CPC .... H01L 31/052–0525; H02S 40/40–44; F24J 2/24; F24J 2/4643; F24J 2/482;
(Continued)

(56) References Cited

U.S. PATENT DOCUMENTS 4,714,734 A * 12/1987 Hashimoto ............ C08K 3/04
152/525
5,001,192 A * 3/1991 Sun ........................ C08L 27/08
525/165
(Continued)

FOREIGN PATENT DOCUMENTS

CN 101563571 10/2009
CN 103178146 6/2013
(Continued)

OTHER PUBLICATIONS

Machine translation of DE202013102248.*
(Continued)

*Primary Examiner* — Eric R Smith
(74) *Attorney, Agent, or Firm* — JCIPRNET (57) ABSTRACT

A photovoltaic thermal collector is provided with: glasses disposed on both a sunlight receiving surface side and an opposite surface side thereto; a hot-water producing portion and a power generating portion. An olefinic rubber sealing member (A) is disposed on at least one surface side of a power generating element of the power generating portion, and an olefinic rubber sheet (B) including carbon black is disposed on an opposite surface side thereto. In addition, a resin pipe as a channel of the hot-water producing portion is made of cross-linked polyethylene or polybutene; the resin pipe is sandwiched in the olefinic rubber sheet (B); and the olefinic rubber sheet (B) is further disposed in a side portion of the resin pipe and in a gap between one resin pipe and another resin pipe.

7 Claims, 5 Drawing Sheets

(51) Int. Cl.
*F24S 21/00* (2018.01)
*H01L 31/048* (2014.01)
*F24S 10/75* (2018.01)
*F24S 80/30* (2018.01)
*C08K 5/14* (2006.01)
*C08J 5/12* (2006.01)
*C08K 3/04* (2006.01)
*C08K 5/01* (2006.01)

(52) U.S. Cl.
CPC .............. *C09K 3/10* (2013.01); *C09K 3/1006* (2013.01); *F24S 10/754* (2018.05); *F24S 21/00* (2018.05); *F24S 80/30* (2018.05); *H01L 31/048* (2013.01); *H01L 31/0488* (2013.01); *C08J 2323/00* (2013.01); *C08K 3/041* (2017.05); *C08K 5/01* (2013.01); *C09K 2003/1078* (2013.01); *C09K 2003/1081* (2013.01); *C09K 2200/0607* (2013.01); *Y02E 10/44* (2013.01)

(58) Field of Classification Search
CPC ... F24J 2/488; F24J 2002/4692; F24S 10/746; F24S 10/754
See application file for complete search history.

(56) References Cited

U.S. PATENT DOCUMENTS

| | | | | |
|---|---|---|---|---|
| 2003/0191243 | A1* | 10/2003 | Hamada | C08F 297/026 525/94 |
| 2008/0083176 | A1* | 4/2008 | Barsun | F24J 2/045 52/173.3 |
| 2011/0100425 | A1* | 5/2011 | Osamura | H01L 31/048 136/246 |
| 2011/0271999 | A1* | 11/2011 | Almogy | F24J 2/07 136/246 |
| 2012/0097217 | A1* | 4/2012 | Yin | H02S 40/44 136/248 |
| 2015/0349177 | A1* | 12/2015 | Rubio | F24S 40/80 136/246 |

FOREIGN PATENT DOCUMENTS

| | | | | |
|---|---|---|---|---|
| CN | 104639038 | | 5/2015 | |
| DE | 202013102248 | U1 * | 6/2013 | ............... F24J 2/482 |
| GB | 1179681 | A * | 1/1970 | ............... B01D 1/02 |
| JP | S58164953 | | 9/1983 | |
| JP | H08014669 | | 1/1996 | |
| JP | H11108467 | | 4/1999 | |
| JP | 2000227256 | | 8/2000 | |
| JP | 2000241030 | | 9/2000 | |
| JP | 2002147865 | | 5/2002 | |
| JP | 2004-176982 | | 6/2004 | |
| JP | 2004176982 | | 6/2004 | |
| JP | 2011190991 | | 9/2011 | |
| JP | 2013002709 | | 1/2013 | |
| JP | 2013131757 | | 7/2013 | |
| WO | 2006038508 | | 4/2006 | |
| WO | WO-2007129985 | A1 * | 11/2007 | ............. H02S 40/44 |
| WO | 2008075584 | | 6/2008 | |

OTHER PUBLICATIONS

Machine translation of JP H58-164953.*
"International Search Report (Form PCT/ISA/210) of PCT/JP2016/79881," dated Nov. 8, 2016, with English translation thereof, pp. 1-4.
"Office Action of Canada Counterpart Application" dated May 17, 2018, p. 1-p. 4.
"Office Action of China Counterpart Application" dated May 23, 2018, with English translation thereof, p. 1-p. 10.
"Office Action of China Counterpart Application," dated Oct. 22, 2018, with English translation thereof, p. 1-p. 13.
"Office Action of China Counterpart Application," with English translation thereof, dated Mar. 27, 2019, p. 1-p. 9.
"Office Action of China Counterpart Application," with English translation thereof, dated Sep. 4, 2019, p. 1-p. 9.
"Office Action of Philippines Counterpart Application," dated Nov. 11, 2019, p. 1-p. 6.

* cited by examiner

FIG. 4 a : Area occupied by one cell
N : Number of cells
A : Area occupied by cell total(A=a x N)

PHOTOVOLTAIC THERMAL COLLECTOR

CROSS-REFERENCE TO RELATED APPLICATION

The present application is a continuation of PCT/JP2016/079881, filed on Oct. 7, 2016, and is related to and claims priority from Japanese patent application no. 2015-211290 (filed on Oct. 27, 2015). The entire contents of the aforementioned application are hereby incorporated by reference herein.

FIELD OF THE INVENTION

The present invention relates to a photovoltaic thermal collector that realizes both power generation with sunlight and supply of hot water with solar heat.

DESCRIPTION OF THE BACKGROUND ART

The photovoltaic power generation is widely performed as an effective power generation system that utilizes natural energy. However, in order to perform the photovoltaic power generation, a wide light receiving surface is needed. Therefore, in order to utilize such a wide area more effectively, another value added to the photovoltaic power generation is considered. As an example of such an added value, it is proposed that a hot-water supply system is added to a photovoltaic power generation system. (refer to Patent Documents 1 and 2).

Figure 6:
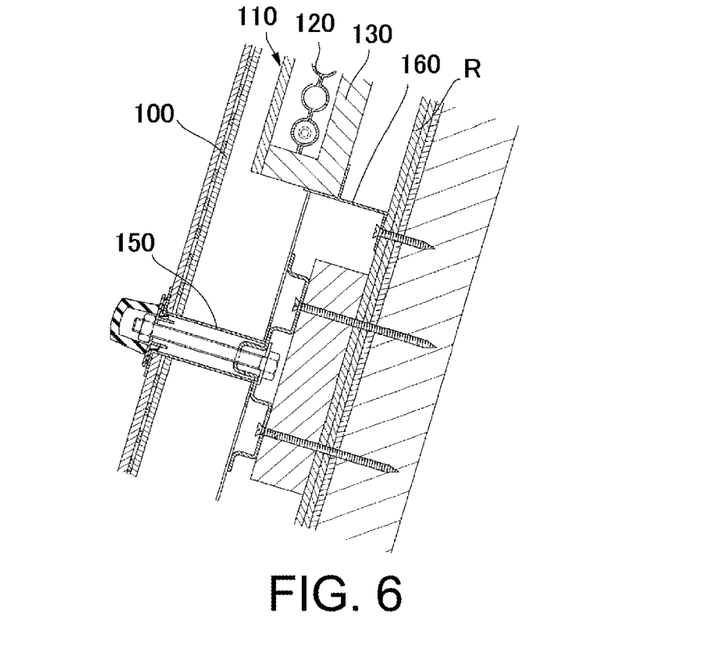
FIG. 6 is an erecting sectional view illustrating attachment of a solar system in the conventional art.

FIG. 6 is an erecting sectional view illustrating a conventional solar system disclosed in Patent Document 1. In the solar system disclosed in Patent Document 1, some panels of solar panels 100 arranged on a roof R or the like are selected; solar hot-water panels 110 including heat collecting pipes 120 and a heat insulation 130 are disposed on only a lower side of the selected panels. Therefore, a following effect is achieved: it is possible to arrange the solar hot-water panels 110 at the optimal positions. However, since the solar panel 100 and the solar hot-water panel 110 are separately manufactured, it is not possible to use an existing frame 150 of the solar panel 100 as is. In other words, since a base 160 of the solar hot-water panel 110 needs to be separately disposed, installation work of the panels is complicated.

Figure 7:
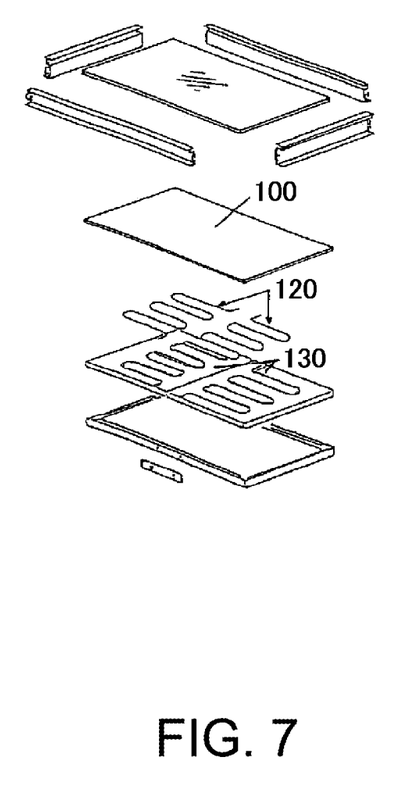
FIG. 7 is an assembling diagram of an integrally formed photovoltaic thermal hot-water panel in the conventional art.

FIG. 7 is an assembling diagram of an integrally formed photovoltaic thermoelectric hot-water panel disclosed in Patent Document 2. Since the photovoltaic thermoelectric hot-water panel disclosed in Patent Document 2 has a structure in which the solar panel 100, the heat collecting pipes 120, and the heat insulation 130 are all integral, the following effect is achieved: it is possible to install a panel having two functions in the conventional frame.

However, in Patent Document 2, the following points still haven't been considered. The heat collecting pipe 120 needs to have corresponding water-pressure resistance performance and long-term durability, and it is difficult to supply sufficient hot water throughout a year when heat storage properties, the strength of the entire panel, or the like is not sufficiently considered.

Further, the conventional hybrid panel has a combined configuration of a heat absorbing sheet and copper pipes in a portion of the panel on a back side of the photovoltaic module, and produces hot water through "heat conduction". In order to reduce heat release from hot water warmed through the copper pipes, the conventional method employs a structure of enclosing the copper pipes and the photovoltaic module with the heat insulation. However, due to a heat retention effect, the temperature of the hybrid module rises to about 100 degrees Celsius. In addition, even though water passes through, a product has a higher temperature than a normal panel, and the high temperature leads to deterioration in power generation performance and a decrease in the service life of the product.

[Patent Document 1] Japanese Unexamined Patent Publication No. 2013-2709
[Patent Document 2] Japanese Unexamined Patent Publication No. 2000-241030

SUMMARY OF THE INVENTION

In consideration of such circumstances, the present invention provides a photovoltaic thermal collector: the photovoltaic thermal collector has the configuration that a resin pipe through which liquid passes adheres to photovoltaic module; the photovoltaic thermal collector is lightweight, low-cost, has long term durability, and is capable of supplying hot water with high efficiency throughout a year.

In order to achieve the above-mentioned features, the photovoltaic thermal collector according to the first invention is characterized as follows.

The photovoltaic module is provided with glasses on a front surface side and a back-surface side thereof and includes a hot-water producing portion and a power generating portion; an olefinic rubber sealing member (A) is disposed on at least one surface side of a power generating element of the power generating portion; an olefinic rubber sheet (B) including carbon black is disposed on an opposite surface side of the power generating element; a resin pipe as a channel of the hot-water producing portion is made of crosslinked polyethylene or polybutene; the resin pipe is sandwiched in the olefinic rubber sheet (B); and the olefinic rubber sheet (B) is further disposed in a side portion of the resin pipe and in a gap between one resin pipe and an adjacent resin pipe.

The photovoltaic thermal collector of the first invention has the olefinic rubber sealing member (A) disposed on the front surface side of the power generating element of the power generating portion and the olefinic rubber sheet (B) disposed on an opposite surface side thereto of the power generating element. Carbon black is contained in the olefinic rubber sheet (B). Thermal energy of sunlight is effectively transmitted to water in the resin pipe through such a configuration, and hot water is produced with high efficiency while the power generation is performed. Hereinafter, effects thereof will be described.

In the photovoltaic module having a two-surface glass structure, a wavelength of sunlight is 380 nm or longer and 2500 nm or shorter, and the sunlight penetrates glass. The olefinic rubber sheet (B) in the photovoltaic thermal collector of the present invention contains carbon black. Such olefinic rubber has a radiation factor of 95% or higher, efficiently absorbs electromagnetic waves penetrating the module, and generates heat. This heat generating body (rubber) again releases almost 100% of the electromagnetic waves through radiation. The electromagnetic waves having a wavelength longer than the wavelength absorbed are released. The electromagnetic waves having wavelength longer than 2500 nm are confined in the glass of the photovoltaic module and changes into long wavelengths from near infrared to far infrared (3 µm or longer and 5 µm or shorter). In addition, the electromagnetic waves are reflected to the glass surface and are confined in the glass. In this manner, the rubber member, the resin pipe, the water in the resin pipe inside the two-surface glass structure absorb the electromagnetic waves with high efficiency, and heat transfer smoothly occurs due to radiation to the water or the like in the resin pipe enclosed in the olefinic rubber sheet (heat absorbing body) in which carbon black is contained.

According to the present invention, the olefinic rubber sheet (B) is disposed in the gap between the resin pipes. Hence, a function of the carbon black in the olefinic rubber sheet (B) causes water molecules to generate heat by a heat transfer mechanism due to the radiation and thereby high efficiency is achieved.

In addition, the photovoltaic thermal collector according to the first invention has the glasses on both of the front surface side (main light-receiving side) and the back-surface side. In this manner, a containment effect of the sunlight (electromagnetic waves) transmitted into the photovoltaic module is achieved and contributes to production of hot water with high efficiency.

Further, the photovoltaic thermal collector according to the first invention uses a polyethylene pipe as the resin pipe and has a property of transmitting far infrared light. Then, energy of the sunlight is effectively transmitted to the liquid such as water in the resin pipe such that it is possible to effectively use the energy of the sunlight, with the pipe enduring the water pressure.

As described above, the configuration of the photovoltaic thermal collector according to the first invention realizes 95% of total solar energy conversion efficiency of the photovoltaic thermal collector of the present invention.

In addition, according to the first invention, the cross-linked polyethylene pipe is used as the resin pipe. Since pressing process is performed in order to manufacture the photovoltaic thermal collector of the present invention, the resin pipe is crushed into a flat shape in some cases; however, when the photovoltaic thermal collectors are connected to each other with a connecting member and an exposed portion of the resin pipe from the photovoltaic thermal collector is heated, the resin pipe may restore the original shape thereof and may be connected without trouble. There is no trouble of water leakage or the like while using the photovoltaic thermal collector of the present invention. Usually, the inside of the pipe has negative pressure after molding or the like, and thus the pipe is likely to be crushed. However, since the crosslinked polyethylene pipe and the polybutene pipe chemically combines with the olefinic rubber, the pipe is not blocked.

According to the first invention, the photovoltaic thermal collector of the second invention is characterized as follows.

The olefinic rubber sealing member (A) is 250 μm or thicker and 500 μm or thinner in thickness.

According to the second invention, the olefinic rubber sealing member (A) is disposed between the photovoltaic module and a rubber member layer on the front surface side of the power generating element of the photovoltaic thermal collector. The thickness thereof is 250 μm or thicker and 500 μm or thinner. In case the thickness is smaller than 250 μm, there is a concern that the power generating element (photovoltaic cell) in the photovoltaic module cracks. In case the thickness is larger than 500 μm, there is a concern that: transparency deteriorates; transmission amount of the sunlight decreases; the power generation performance of the photovoltaic module deteriorates; and efficiency of production of hot deteriorates.

According to the first invention, the photovoltaic thermal collector of the third invention is characterized as follows.

The olefinic rubber sheet (B) contains one or a blend of two kinds selected from acetylene black, ketjen black, and carbon nanotubes, and the added content thereof is 20 parts or higher by weight and 100 parts or lower by weight to 100 parts by weight of the olefin rubber sheet.

In case the photovoltaic thermal collector of the third invention is used, the olefinic rubber sheet (B) used therein contains the one or the blend of two kinds selected from acetylene black, ketjen black, and carbon nanotubes. Hence, since the photovoltaic thermal collector has high heat conductivity and has a function of converting near infrared light into far infrared light, it is possible to remarkably improve energy utilization efficiency of the sunlight.

According to the first invention, the photovoltaic thermal collector of the fourth invention is characterized as follows.

The glass is 0.8 mm or thicker and 4.0 mm or thinner in thickness.

According to the fourth invention, the glass used on the front surface side and the back-surface side in the photovoltaic thermal collector is 0.8 mm or thicker and 4.0 mm or thinner in thickness. Preferably, the thickness is 2.0 mm or thicker and 3.2 mm or thinner. In case the thickness is thinner than 0.8 mm, there is a concern that the glass cracks while manufacturing the photovoltaic module. In case the thickness is thicker than 4.0 mm, there is a concern that the weight of the photovoltaic thermal collector largely increases.

According to the first invention, the photovoltaic thermal collector of the fifth invention is characterized as follows.

The photovoltaic thermal collector having a two-surface glass structure is 10 mm or thicker and 40 mm or thinner in thickness.

According to the fifth invention, the photovoltaic thermal collector of the present invention is 10 mm or thicker and 40 mm or thinner in thickness. In case the thickness is thinner than 10 mm, there is a concern that it is not possible to fulfill the function of producing the hot water of the photovoltaic thermal collector of the present invention. In case the thickness is thicker than 40 mm, there is a concern that the weight largely increases and installation workability remarkably deteriorates.

According to the first invention, the photovoltaic thermal collector of the sixth invention is characterized as follows.

The resin pipe is 20 m or longer and 100 m or shorter in length.

According to the sixth invention, the resin pipe in the photovoltaic thermal collector is 20 m or longer and 100 m or shorter in length, and preferably is 20 m or longer and 60 m or shorter. In case the length of the resin pipe is longer than 100 m, workability of a winding process deteriorates, and the photovoltaic thermal collector corresponding to the length of the resin pipe increases in size. Therefore, actually, the photovoltaic thermal collector having such a large size is not manufactured. It is not preferable that the length of the resin pipe is shorter than 20 m, because: there is a concern that heat collecting performance deteriorates, and predetermined hot water is not obtained; further, the weight of the module increases and installation workability remarkably deteriorates.

In order to achieve the above-mentioned object, a method for manufacturing the photovoltaic thermal collector according to the seventh invention is characterized as follows.

The power generating portion, the olefinic rubber sheet (B), and the hot-water producing portion of the photovoltaic thermal collector according to any one of the first invention to the sixth invention are simultaneously piled up and are press-formed in vacuum heating.

According to the seventh invention, the members of the power generating portion including the olefinic sealing member (A), the olefinic rubber sheet (B), and the members of the hot-water producing portion of the photovoltaic thermal collector are simultaneously piled up (stacked), are put into a laminating device, and are press-formed in vacuum heating, and thereby it is possible to manufacture the photovoltaic thermal collector of the present invention. According to the manufacturing method of the present invention, it is possible to manufacture the photovoltaic thermal collector by the laminating device as a manufacturing device of a photovoltaic module, and it is possible to remarkably improve efficiency of the manufacturing.

Other features and advantages of the present invention will be apparent from the following description when taken in conjunction with the accompanying drawings, in which like reference characters designate similar or identical parts throughout the several views thereof.

DETAILED DESCRIPTION

A detailed description will now be given of illustrative embodiments of the present invention, with reference to the accompanying drawings. In so doing, specific terminology is employed solely for the sake of clarity, and the present disclosure is not to be limited to the specific terminology so selected. It is to be understood that each specific element includes all technical equivalents that operate in a similar manner and achieve a similar result.

Figure 1:
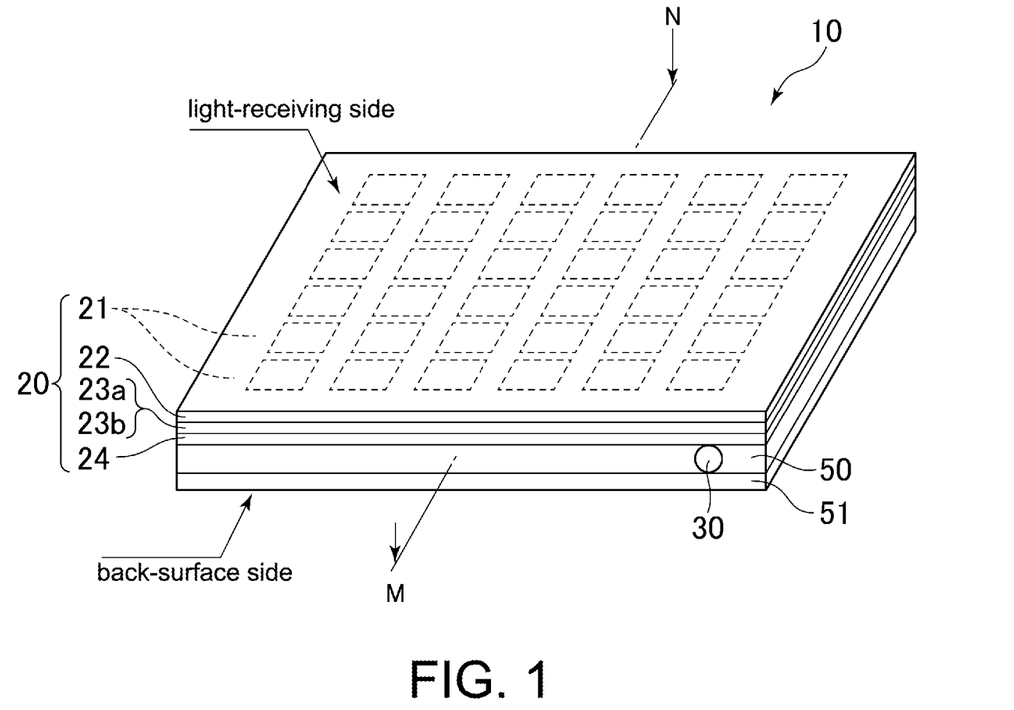
FIG. 1 is a perspective view of a photovoltaic thermal collector of the present invention.
Figure 2:
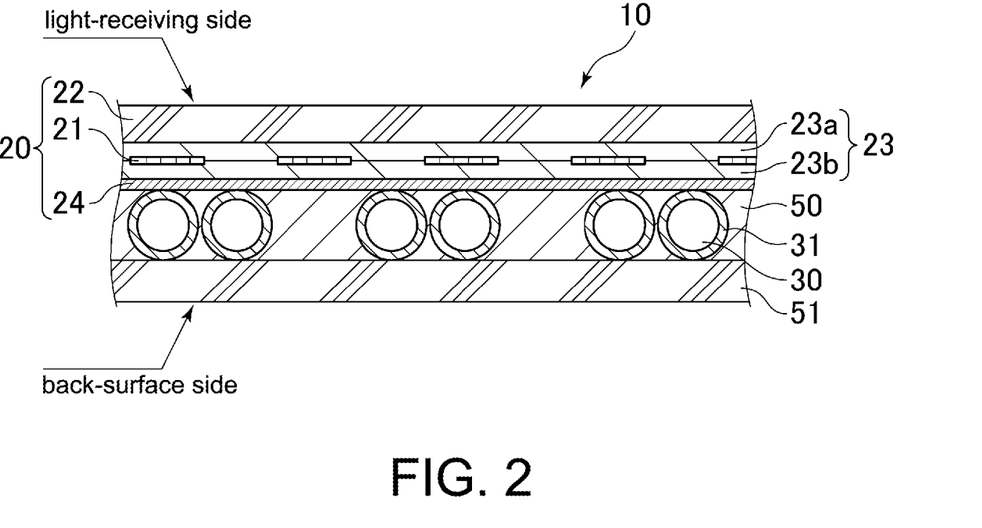
FIG. 2 is a sectional view of the photovoltaic thermal collector of the present invention.
Figure 3:
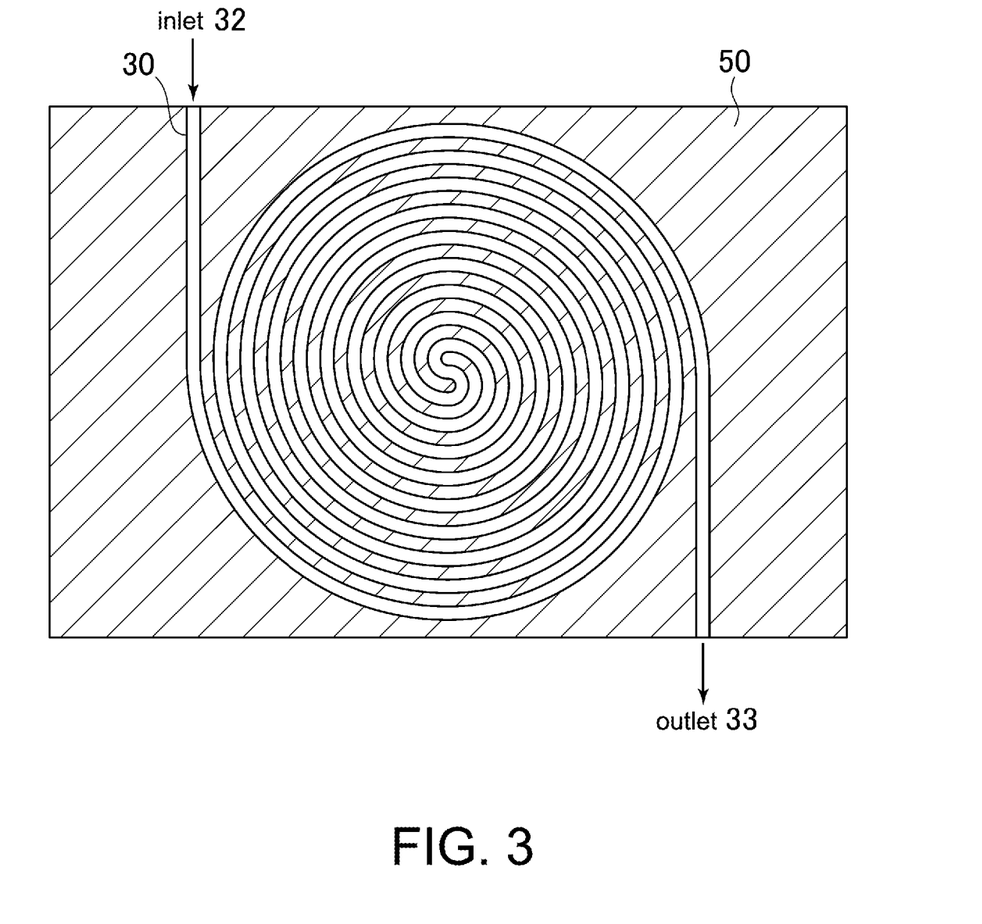
FIG. 3 is a view illustrating arrangement of resin pipes of the photovoltaic thermal collector of the present invention.

FIG. 1 is a perspective view of the photovoltaic thermal collector of the present invention, and FIG. 2 is a sectional view of the photovoltaic thermal collector of the present invention. In addition, FIG. 3 is a plan view illustrating a flat plane across a straight line MN in the photovoltaic thermal collector module 10 of the present invention, and a view illustrating arrangement of resin pipe thereof. The photovoltaic thermal collector 10 includes a solar panel 20 (power generating portion) having photovoltaic cells 21 as power generating elements, and a hot-water producing portion having resin pipes 31 on a back side of the solar panel 20. The solar panel 20 and the hot-water producing portion integrally adhere to each other with a rubber member 50. The object of the photovoltaic thermal collector is as follows: a liquid such as water or an antifreeze flows through the resin pipe 31; and a temperature of the liquid flowing into a resin pipe inside 30 increases due to solar heat received by the solar panel 20. If the pipe is replaced by a silicon tube or a fluorine tube, oil or the like is considered as a type of liquid. However, normally, in case water is used, the hot water is supplied. Therefore, it is possible to use the hot water obtained with the photovoltaic thermal collector in not only a facility such as a bathhouse facility that needs a large amount of hot water, but also in an ordinary household. In general, in case an antifreeze is used, tap water is changed into hot water through a heat exchanger. In case the temperature does not reach the predetermined temperature, it is possible to comfortably and economically obtain hot water by a system that the hot water is rewarmed in a boiler. In addition, since heat received by the photovoltaic thermal collector of the present invention is rapidly transmitted to the resin pipe 31, an increase in temperature of the photovoltaic cells 21 as the power generating portion is reduced and an effect of improving power generating efficiency of the photovoltaic thermal collector arises.

The photovoltaic thermal collector 10 has the configuration: the photovoltaic thermal collector includes front-surface glass 22 of the solar panel 20 on the light receiving surface side and back-surface glass 51 on the back-surface side; the resin pipes 31 are enclosed by a rubber member 50. An olefinic rubber sheet (B) is used as the rubber member 50. A member having an adhesion function is contained in the olefinic rubber sheet (B): the resin pipes 31 and the rubber member 50 can integrally adhere to each other by heat received in the under-mentioned laminating process. Structurally, a top portion of the resin pipe 31 is in contact with the back sheet 24 of the solar panel 20 (power generating portion) and the back-surface glass 51. Since the resin pipe 31 is in contact with the olefinic rubber sheet (B), solar heat from the solar panel 20 side is transmitted to water or the like in the resin pipe 31 with high efficiency. The olefinic rubber sheet (B) has a function of heat absorbing member. Due to such a configuration that the photovoltaic module (solar panel 20) is sandwiched between the front-surface glass 22 and the back-surface glass 51, a heat storage effect increases, and further the strength of the entire photovoltaic thermal collector increases. The sealing member 23 (23a-23b) is used for adhesion and sealing of the front-surface glass 22 of the solar panel 20, the photovoltaic cells 21 thereof, and the back sheet 24 thereof. An olefinic sealing member (A) is used as the sealing member 23 (23a-23b). In addition, an olefinic sealing material disclosed in Japanese Patent Application No. 2014-34405 filed on Feb. 25, 2014 by an applicant may be used as the sealing member.

In the conventional art, a pipe or the like made of copper has been used as a heat collecting pipe that absorbs the solar-heat. However, in case the pipe is integrally disposed with the solar panel 20, the pipe has to be used for a long time. In addition, in case the pipe is made of copper, heat is quickly released. Hence, in winter when hot water is particularly necessary, it is not possible to obtain sufficient heat collection, and it is difficult to achieve an effect of supplying hot water. In the present invention, the resin pipes 31 are employed. Because the resin pipes have a property of high corrosion resistance and low heat release. Polyethylene and polybutene are suitable as materials for the resin pipe 31.

The resin pipes need to have the water-pressure resistance performance of 0.2 MPa or higher at 25 degrees Celsius. In case the resin pipe does not have such water-pressure resistance performance, there is a concern that the photovoltaic thermal collector 10 swells in an out-of-plane direction and breaks.

In addition, as illustrated in FIG. 3, the resin pipe 31 is disposed such as a spiral shape with respect to one sheet of the photovoltaic thermal collector 10. The resin pipe used in one sheet thereof is 20 m or longer and 100 m or shorter in length. In FIG. 3, a single resin pipe 31 is disposed helicoidally; however, it is possible to employ a configuration that two or three pipes are disposed in parallel and such as a spiral shape. Further, the resin pipes may be disposed in the state that one resin pipe makes contact with another as illustrated in FIG. 2. Through the configuration that the resin pipes 31 are disposed in the aforementioned state, a heat absorption amount of the solar heat to the resin pipe 31 increases, and it is possible to produce hot water with high efficiency. In addition, in FIG. 3, the photovoltaic thermal collector of the present invention is provided with an inlet 32 and an outlet 33 of the water or the like in the surface thereof. An aluminum sheet which does not adhere to the rubber material (B) is stacked in the vicinity of the inlet and the outlet of the resin pipe 31 of the photovoltaic thermal collector, and the aluminum sheet is removed after the forming. In this manner, the resin pipe 31 can be pulled along with the crosslinked rubber material at the substantially right angle, and the pulled resin pipes may be used as the inlet 32 and the outlet 33.

Figure 4:
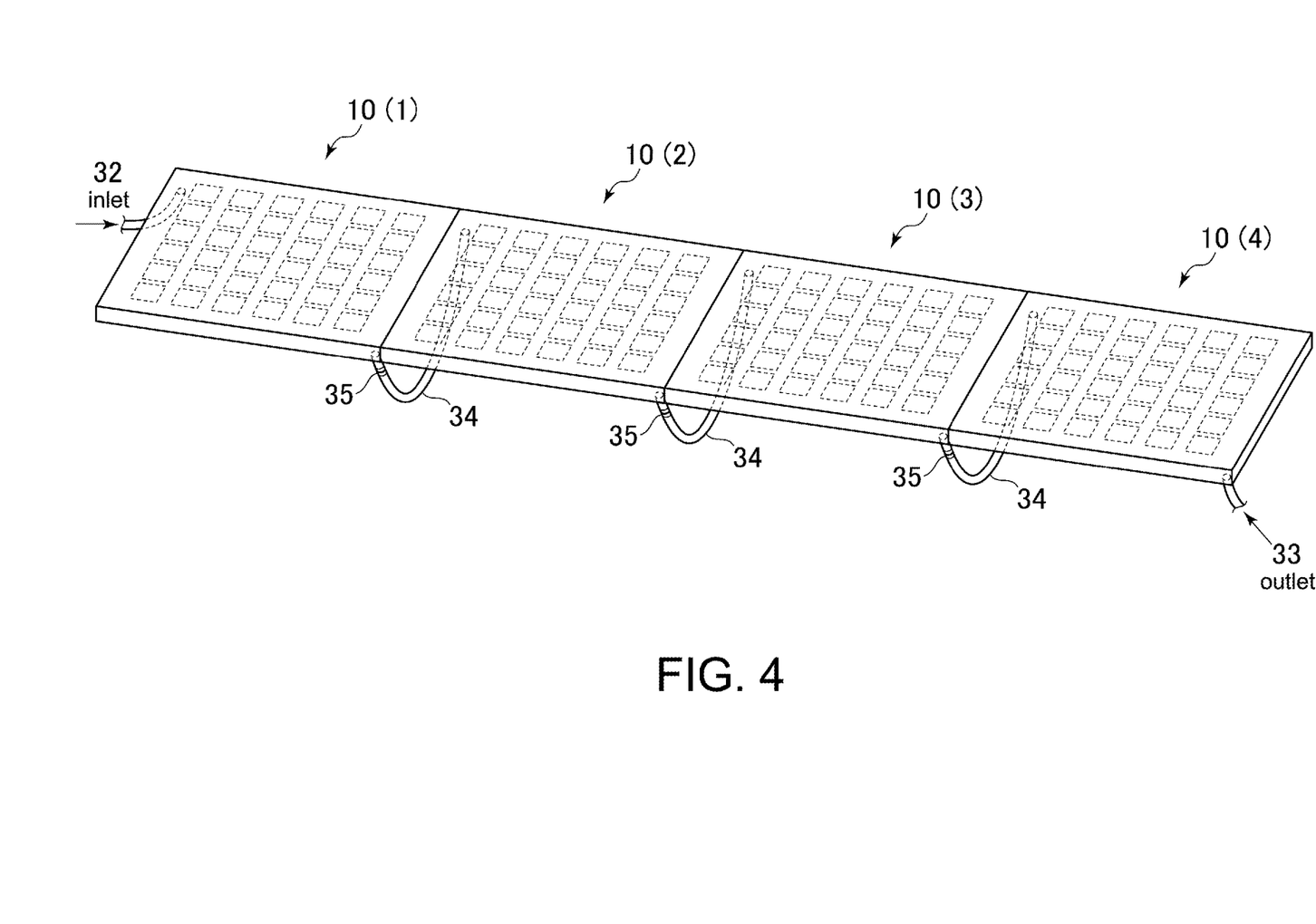
FIG. 4 is a view illustrating a connecting method of the photovoltaic thermal collector of the present invention.
Figure 5:
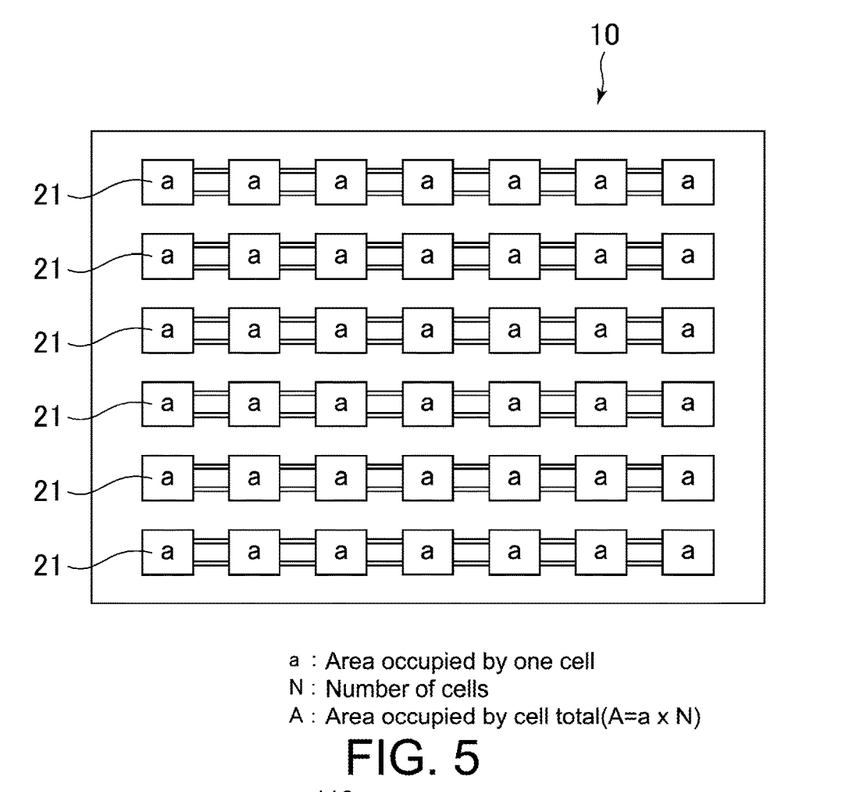
FIG. 5 is a view illustrating an arrangement state of photovoltaic cells of the photovoltaic thermal collector of the present invention.

FIG. 4 is a view illustrating the installed photovoltaic thermal collector of the present invention. A description is given of the case that four sheets of photovoltaic thermal collector 10(1)•10(2)•10(3)•10(4) are disposed. The inlet 32 and outlet 33 can be pulled out at the substantially right angle on the back-surface glass 51 side as described above. Through this manner, the photovoltaic thermal collectors of the present invention can be disposed without a gap as illustrated in FIG. 4. An inlet 32(1) of the photovoltaic thermal collector 10(1) and an outlet 33(2) thereof are connected through a connecting pipe 34. Similarly, the photovoltaic thermal collector 10(2) and 10(3), the photovoltaic thermal collector 10(3) and 10(4) are connected through the connecting pipe 34. The connecting pipe 34 has a connecting portion 35 in the inlet 32 and the outlet 33 of the photovoltaic thermal collector. As described above, the inlet 32 and the outlet 33 of the photovoltaic thermal collector are connected as illustrated in FIG. 4. Hence, pipe of the connecting portions is disposed on a low portion of the photovoltaic thermal collector. It is possible to perform connecting work through a known technology in the conventional art, and it is easy to perform the installation work. In addition, it is possible to dispose the photovoltaic thermal collectors without a gap, and thus it is possible to save space.

In addition, the crosslinked polyethylene pipe is used as the resin pipe in the present invention, and thereby the following effects arise. In other words, since pressing process is performed during the manufacturing of the photovoltaic thermal collector of the present invention, the resin pipes are crushed into a flat shape; however, when the photovoltaic thermal collectors are connected to each other with the connecting member, the resin pipes restore the original shape thereof and are connected without trouble through heating an exposed portion of the resin pipe from the photovoltaic thermal collector. There is no trouble of water leakage or the like from the connecting portion during use of the photovoltaic thermal collector of the present invention.

Hereinafter, a method for manufacturing the photovoltaic thermal collector is briefly described. It is possible to manufacture the photovoltaic thermal collector 10 according to the present invention through pressing process in a vacuum atmosphere with laminating apparatus. Constituting members (the front-surface glass 22; the sealing member 23a; the photovoltaic cell 21; the sealing member 23b; and the back sheet 24) of the solar panel 20, the olefinic rubber sheet (heat absorbing member) 50, the resin pipes 31, the olefinic rubber sheet (heat absorbing member) 50, and the back-surface glass 51 are stacked, and the photovoltaic thermal collector is manufactured through a vacuum process and a pressing process of the laminating apparatus. Hence, in the pressing process, in case an occupation area of the resin pipe 31 decreases, there is a concern that the pipe is crushed. Therefore, the resin pipe 31 needs to have a predetermined area (length).

EXAMPLE

Example 1

In molding conditions with PVL-1537 manufactured by Nisshinbo Mechatronics Inc.: a vacuum time (ten minutes); a pressing time (25 minutes) at a press temperature of 160 degrees Celsius, the member (1) to the member (8) were stacked in this order, and molding process was performed through a procedure of the production of the normal photovoltaic module that is performed by those skilled in the art. In order to reduce an occurrence of crushing of the resin pipe, an aluminum mold having a height of 19 mm was used, and pressing process was performed. Electrodes were drawn out between the front-surface glass and the back-surface glass, and an electrode portion was sandwiched in the member (4), and simultaneously molding process was performed. After the photovoltaic thermal collector was molded as described above and was soldered with a junction box manufactured by Onamba Co., Ltd., an aluminum frame was attached and the photovoltaic thermal collector of Example 1 was obtained. Hereinafter, the members (1) to (8) are described.

(1) Front-surface glass: tempered glass (2.5 t)
(2) Olefinic rubber sealing material: transparent olefinic sealing material; member corresponding to the sealing member 23a in FIG. 2.
Thickness of 300 µm (a); sold by Ryoko Chemical Co., Ltd.
(3) A string that 36 pieces of single crystal cells manufactured by JA Solar Co. Ltd. are connected.
(4) A white olefinic rubber sealing material: member corresponding to the sealing member 23b and the back sheet 24 in FIG. 2.
Thickness of 350 µm; manufactured by Lintec Corporation; brand LIPREA; sold by Ryoko Chemical Co., Ltd.
(5) An olefinic rubber sheet (heat absorbing member): member corresponding to rubber member 50 in FIG. 2.
A compound of: EDPM (100 parts by weight) manufactured by Mitsui Chemical, Inc.; acetylene black (50 parts by weight); paraffin oil P380 (10 parts by weight); and DCP (3.5 parts by weight).
(6) Resin Pipe 7A crosslinked polyethylene resin pipe manufactured by INOAC Corporation; the total length of the resin pipe 7A is 46 m.
(7) Olefinic rubber sheet (heat absorbing member): the same as the member (5)
(8) Back-surface glass: tempered glass (2.5 t)

Example 2

A photovoltaic thermal collector of Example 2 was obtained in the same method as that of Example 1 except that: the member (4) was 300 µm in thickness; the carbon black contained in the heat absorbing member of the member (5) and the member (7) was acetylene black (35 parts by weight) and ketjen black (15 parts by weight); and the resin pipe of the member (6) had a use length of 50 m.

Comparative Example 1

A photovoltaic thermal collector of Comparative Example 1 was obtained in the same method as that of Example 1 except that: the member (2) was EVA (450 µm in thickness); the member (4) as a sealing member portion was EVA (600

µm in thickness); the carbon black contained in the heat absorbing member of the member (5) and the member (7) was Asahi #60 (60 parts by weight), and the resin pipe of the member (6) had a use length of 10 m.

Comparative Example 2

A photovoltaic thermal collector of Comparative Example 2 was obtained in the same method as that of Example 1 except that: the member (2) was EVA (450 µm in thickness); a sealing member portion of the member (4) was EVA (600 µm in thickness); the carbon black contained in the heat absorbing member of the member (5) and the member (7) was Ultrasil 360 (50 parts by weight) manufactured by Degussa-Hüls AG Corporation; and the resin pipe of the member (6) had a use length of 40 m.

[Cracks in Cell]

Cracks in cell of the photovoltaic thermal collector prepared in Example 1, Example 2, Comparative Example 1, and Comparative Example 2 were evaluated in accordance with the following indexes. Results of the evaluation are shown in Table 1.

<Evaluation Points>

Evaluation point, 3 points: No cracks in a cell.

Evaluation point, 2 points: One crack is found per three cells.

Evaluation point, 1 point: numerous cracks are found in cells.

[Heat Collecting Performance]

Heat collecting performance of the photovoltaic thermal collector prepared in Example 1, Example 2, Comparative Example 1, and Comparative Example 2 were evaluated as follows. Evaluation was performed in sunny weather in which the flow rate of water is 200 L/Hr and the amount of solar radiation is 600 (W/m2) or higher. The amount of solar radiation was measured with an IV checker manufactured by EIKO instruments Co., Ltd. In addition, an increase in temperature of the water in the photovoltaic thermal collector was obtained through: measuring a difference between the temperature of source water and the temperature of hot water; measuring the amount of water stored for one minute with accuracy; obtaining a heat collecting amount; and converting the obtained value into unit of (W/m2). Heat collecting efficiency (%) of the photovoltaic thermal collector was calculated with the following equation. Results of the evaluation are shown in Table 1.

Heat collecting efficiency (%)=[{heat amount (*W*/m2)}/{amount of solar radiation (*W*/m2)}]×100

As many apparently widely different embodiments of the present invention can be made without departing from the spirit and scope thereof, it is to be understood that the invention is not limited to the specific embodiments thereof except as defined in the appended claims.

What is claimed is:

1. A photovoltaic thermal collector,
   wherein a photovoltaic module is provided with glasses on a front surface side and a back-surface side of the photovoltaic module, and comprises
   a hot-water producing portion and a power generating portion;
   an olefinic rubber sealing member (A) that is disposed on at least one surface side of a power generating element of the power generating portion;
   an olefinic rubber sheet (B) that comprises carbon black and is disposed on an opposite surface side of the power generating element;
   a resin pipe as a channel of the hot-water producing portion that is made of crosslinked polyethylene or polybutene, wherein the resin pipe has a top portion, a side portion and a bottom portion opposing the top portion; and
   the olefinic rubber sheet (B) is further disposed to surround the side portion of the resin pipe and in a gap between the resin pipe and an adjacent resin pipe,
   wherein the resin pipe is sandwiched in the olefinic rubber sheet (B) in a way that the olefinic rubber sheet (B) covers the side portion and exposes the top portion and the bottom portion of the resin pipe, and
   the resin pipe is disposed in a spiral shape with respect to one sheet of the photovoltaic thermal collector, and the top portion of the resin pipe is in physical contact with a back sheet of the power generating portion, and the bottom portion of the resin pipe is in physical contact with the glass on the back-surface side, wherein the back sheet is made of polymer material.

2. The photovoltaic thermal collector according to claim 1,
   wherein the olefinic rubber sealing member (A) is 250 µm or thicker and 500 µm or thinner in thickness.

3. The photovoltaic thermal collector according to claim 1,
   wherein the olefinic rubber sheet (B) comprises one or a blend of two kinds selected from acetylene black, ketjen black, and carbon nanotubes, with an added

TABLE 1

|  |  | Example 1 | Comparative Example 1 | Example 2 | Comparative Example 2 |
|---|---|---|---|---|---|
| Glass |  | On both surfaces | On both surfaces | On both surfaces | On both surfaces |
| Sealing member |  | Olefinic rubber 350/350 µm | EVA/EVA 450/600 µm | Olefinic rubber 300/300 µm | EVA/EVA 450/600 µm |
| Heat absorbing member |  | applied | applied | applied | applied |
| Carbon black (parts by weight) | acetylene | 50 | — | 35 | — |
|  | ketjen | — | — | 15 | — |
|  | Asahi#60 | — | 60 | — | — |
|  | ultrasil 360 | — | — | — | 50 |
| resin pipe (m) |  | 40 | 10 | 50 | 40 |
| ① Cracks in cell |  | 3 points | 1 point | 3 points | 1 point |
| ② Heat collecting property |  | 75 | 25 | 80 | 10 | content of 20 parts or higher by weight and 100 parts or lower by weight, to 100 parts by weight of the olefin rubber sheet (B).

4. The photovoltaic thermal collector according to claim 1, wherein the glasses are 0.8 mm or thicker and 4.0 mm or thinner in thickness.

5. The photovoltaic thermal collector according to claim 1, wherein the photovoltaic module having a two-surface glass structure is 10 mm or thicker and 40 mm or thinner in thickness.

6. The photovoltaic thermal collector according to claim 1, wherein the resin pipe is 20 m or longer and 100 m or shorter in length.

7. A method for manufacturing the photovoltaic thermal collector according to claim 1, wherein the power generating portion, the olefinic rubber sheet (B), and the hot-water producing portion of the photovoltaic thermal collector are simultaneously piled up and press-formed in vacuum heating.

* * * * *